United States Patent [19]

Takamiya

[11] Patent Number: 4,675,875
[45] Date of Patent: Jun. 23, 1987

[54] SURFACE EMITTING SEMICONDUCTOR LASER

[75] Inventor: Saburo Takamiya, Itami, Japan

[73] Assignee: Mitsubishi Denki Kabushiki Kaisha, Tokyo, Japan

[21] Appl. No.: 602,470

[22] Filed: Apr. 20, 1984

[30] Foreign Application Priority Data

Aug. 18, 1983 [JP] Japan ............................. 58-151891

[51] Int. Cl.$^4$ ............................................. H01S 3/19
[52] U.S. Cl. ...................................... 372/45; 357/17; 372/46
[58] Field of Search .............. 372/44, 45, 46; 357/16, 357/17

[56] References Cited

U.S. PATENT DOCUMENTS 4,309,670  1/1982  Burnham et al. .................... 372/46

FOREIGN PATENT DOCUMENTS

| 0025362 | 3/1981 | European Pat. Off. |
| 1413437 | 11/1975 | United Kingdom . |
| 1546729 | 5/1979 | United Kingdom . |
| 2025123 | 1/1980 | United Kingdom . |
| 2081963 | 2/1982 | United Kingdom . |
| 2023928 | 11/1982 | United Kingdom . |

OTHER PUBLICATIONS

"Buried Convex Waveguide Structure (GaAl) As Injection Lasers"; Shima et al; *Applied Phys. Letts.* 38(8), 15 Apr. 1981.

"GaInAsP/InP Surface Emitting Injection Lasers"; Soda et al., *Jpn. J. Appl. Phys.* vol. 18 (1979), No. 12.

*Primary Examiner*—James W. Davie
*Attorney, Agent, or Firm*—Lowe, Price, Leblanc, Becker & Shur

[57] ABSTRACT

A surface emitting semiconductor laser comprising an active layer having a convex portion is disclosed in this specification. This surface emitting semiconductor laser has a structure in which an n-type first semiconductor layer, a p-type active layer and a p-type second semiconductor layer are formed one upon another on one surface of an n-type semiconductor substrate having a concave portion. The active layer has a convex portion corresponding to the concave portion of the semiconductor substrate. On the other surface of the semiconductor substrate, there is provided a negative electrode in the form of a ring surrounding the above stated concave portion. A positive electrode is electrically connected to the above stated second semiconductor layer through an insulating layer having a contact hole. A forbidden band width of the material forming the active layer is smaller than the respective forbidden band widths of the materials forming the other semiconductor layers. The active layer has a large refractive index with respect to the laser light to be oscillated, as compared with the refractive indexes of the other semiconductor layers. Under these conditions, the convex portion of the active layer functions as an optical convex lens. Laser light is generated in a direction perpendicular to the active layer and converged by the above stated convex lens so that it is emitted to the exterior.

16 Claims, 9 Drawing Figures ized surface emitting semiconductor laser and a manufacturing method thereof, by which laser oscillation with low active current and high efficiency can be realized by decreasing reactive current and effectively utilizing the emitted light.

SURFACE EMITTING SEMICONDUCTOR LASER

BACKGROUND OF THE INVENTION

1. Field of the Invention

The present invention relates to a surface emitting semiconductor laser and particularly to a surface emitting semiconductor laser and a manufacturing method thereof, by which laser oscillation with low active current and high efficiency can be realized by decreasing reactive current and effectively utilizing the emitted light.

2. Description of the Prior Art

Semiconductor lasers have been put into practical use in optical communication, laser printers, photo-disk players etc. A semiconductor laser manufactured and practically utilized at present has an active region in a specified surface of a semiconductor wafer, parallel to the major surface of the semiconductor wafer and utilizes, as mirrors, a pair of plane surfaces which are obtained by cleavage and intersect orthogonally with the above stated major surface. In consequence, as is different from an ordinary semiconductor device, such a semiconductor laser involves problems in that characteristic tests and passivation can be applied only after separation into a tip state by cleavage. Because of such problems, it is difficult at present to mass-produce semiconductor lasers having the ordinary structure.

In order to solve such problems, inventive or experimental technique have been considered for forming mirrors by etching, instead of cleavage and surface emitting semiconductors to which the present invention is related. Such surface emitting semiconductor lasers are disclosed for example by H. Soda, K. Iga, C. Kitahara and Y. Saematsu in "GaInAsP/InP Surface Emitting Injection Lasers", Japan Journal of Applied Physics., Vol. 18, No. 12, pp. 2329–2330 (1979). However, it is difficult to form, by etching, mirrors as plane as those formed by cleavage and a method for realizing a surface emitting semiconductor laser capable of obtaining laser oscillation by low active current is not yet developed. Under these circumstances, little progress is made for drastically improving semiconductor lasers using cleavage. For example, a surface emitting semiconductor laser utilizing cleavage, in which an active layer in the form of a convex lens is provided in the interior is disclosed by K. Shima et al. in "Buried Convex Waveguide Structure (GaAl)As Injection Lasers", Appl. Phys. Lett., Vol. 38(8), pp. 605–606 (15 Apr., 1981). However, this semiconductor laser cannot realize surface light emission.

A sectional view of a conventional surface emitting semiconductor laser examined by experiment is shown in FIG. 1. The semiconductor laser in FIG. 1 comprises an n-type semiconductor substrate 10 having a surface 11 formed as a mirror and another surface 12 plane and parallel to the surface 11. An n-type first semiconductor layer 20 is epitaxially grown on the surface 12 and a p-type active layer 30 is epitaxially grown on this first semiconductor layer 20. The interface between the first semiconductor layer 20 and the active layer 30 forms a PN junction $J_1$. A p-type second semiconductor layer 40 is epitaxially grown on the active layer 30 and one surface 41 thereof functions as a mirror. A negative electrode 50 is formed on the above described surface 11 of the semiconductor substrate 10 so that it may be in the form of a ring having an opening 51 in the center. On the surface 41 of the above described second semiconductor layer 40, there is formed an insulating film 60, which has an extremely small contact hole 61 in a position opposed to the central portion of the above described opening 51 of the negative electrode 50. A positive electrode 70 is formed on the insulating film 60 and is electrically connected to the surface 41 of the second semiconductor layer 40 through the contact hole 61 of the insulating film 60. The active layer 30 is formed of a material having a forbidden band width smaller than the respective forbidden band widths of the materials forming the semiconductor substrate 10, the first semiconductor layer 20 and the second semiconductor layer 40.

Now, description will be made of the operation of a surface emitting semiconductor laser thus structured. First, when voltage is applied between the positive electrode 70 and the negative electrode 50, current $i_1$ flows between the positive electrode 70 and the negative electrode 50. This current $i_1$ has a high current density in the vicinity of the positive electrode 70 and a low current density in the vicinity of the negative electrode 50, respectively, as shown by the dotted lines in FIG. 1. On the other hand, carrier confinement effect is generated in the active layer 30 since the active layer 30 is interposed between the p-type second semiconductor layer 40 and the n-type first semiconductor layer 20 and is formed of a material having a forbidden band width smaller than the respective forbidden widths of the semiconductor substrate 10, the first semiconductor layer 20 and the second semiconductor 40. As a result, concentration of the holes and electrons injected into the active layer 30 increases, and if an amount of current $i_1$ exceeding a threshold value flows, stimulated light emission is caused. Consequently, light moves back and forth repeatedly between a pair of mirrors formed by the surface 41 of the second semiconductor layer 40 and one surface 11 of the semiconductor substrate 10. Such optical path is shown by the chain line in FIG. 1, where light $l_1$ moves back and forth in the direction shown by the arrows and is amplified each time it passes through the active layer 30. Repetition of the amplification causes laser oscillation and a part of the laser light generated as the result is emitted from the surface 11 of the semiconductor substrate 10 to the exterior, as shown by the arrow $L_1$.

However, since the surface emitting semiconductor laser thus structured does not have a function of converging light in the direction of an optical axis perpendicular to the active layer 30, most of the generated light is dissipated and only an extremely small amount of light is utilized for stimulated light emission. Accordingly, active current and a heat generation in this surface emitting semiconductor laser become extremely large. In consequence, pulse oscillation can be barely performed at a low temperature of approximately 77 K., and at the room temperature, the threshold current is 1.5 A and the electric power efficiency is 0.1%, resulting in high active current and low efficiency.

In addition, if laser oscillation is caused, the carrier concentration in the region subjected to the oscillation is decreased due to the recombination of electrons and holes and light moves to other regions of high carrier concentration, since light amplification and laser oscillation are caused by the recombination of electrons and holes in the portions where the concentration of electrons and holes is high. More specifically, the optical path always moves and is never fixed, which makes the oscillation mode unstable.

SUMMARY OF THE INVENTION

An object of the present invention is to provide a surface emitting semiconductor laser with low active current and high efficiency.

Another object of the present invention is to provide a surface emitting semiconductor laser capable of emitting laser light having a stabilized oscillation mode.

Another object of the present invention is to provide a surface emitting semiconductor laser having a small heat generation.

A further object of the present invention is to provide a surface emitting semiconductor laser which can be easily assembled and can be handled in the same manner as in case of a light emitting diode.

A still further object of the present invention is to provide a surface emitting semiconductor laser in which divergence of laser light can be made narrow.

In order to attain the above described objects, the present invention presents a surface emitting semiconductor laser comprising: an active layer including a semiconductor and having a first surface and a second surface opposed to each other; first and second semiconductor regions respectively formed on the above stated first and second surfaces; and first and second electrodes electrically connected to the above stated first and second semiconductor regions respectively, a convex portion being formed in at least one of the first and second surfaces of the above stated active layer. If and when voltage is applied between the above stated first and second electrodes, the above stated surface emitting semiconductor laser emits laser light in a direction perpendicular to the above stated active layer.

According to a preferred embodiment of the present invention, the above stated first semiconductor region comprises a semiconductor substrate and a first semiconductor layer and the semiconductor substrate has a concave portion in a position opposed to the above stated convex portion.

An advantage of a surface emitting semiconductor laser in accordance with the present invention is that active current is of a low value and high efficiency can be obtained.

Another advantage of the present invention is that laser light having a stabilized oscillation mode can be emitted.

A further advantage of the present invention is that a heat generation in the interior of a surface emitting semiconductor laser is small.

A still further advantage of a surface emitting semiconductor laser in accordance with the present invention is that assembling and handling thereof can be easily made and handling can be made in the same manner as in case of a light emitting diode.

A still further advantage of a surface emitting semiconductor diode in accordance with the present invention is that divergence of laser light can be made narrow.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
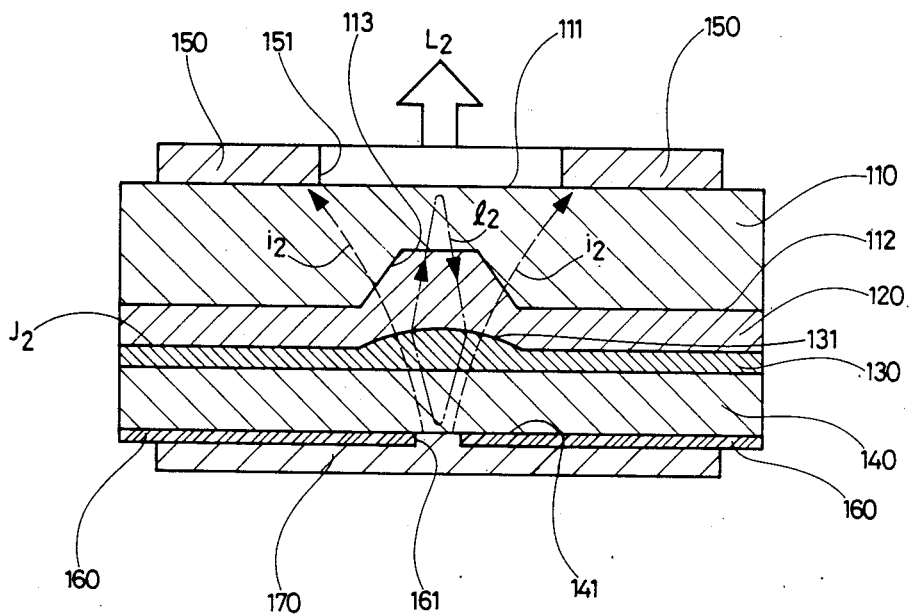
FIG. 2 is a sectional view of a surface emitting semiconductor laser in accordance with an embodiment of the present invention.

FIG. 2 is a sectional view showing a surface emitting semiconductor laser in accordance with an embodiment of the present invention. The semiconductor laser shown in FIG. 2 comprises an n-type semiconductor substrate 110 having one surface 111 formed as a mirror and the other surface 112 opposed to the surface 111. In the central portion of the above stated other surface 112, a concave portion 113 in the shape of a truncated cone is formed. On the above stated other surface 112, an n-type first semiconductor layer 120 is epitaxially grown and in a surface thereof opposed to the above stated concave portion 113, a concavity is formed. On the first semiconductor layer 120, a p-type active layer 130 is epitaxially grown and the interface between this active layer 130 and the above stated first semiconductor layer 120 forms a PN junction $J_2$. Corresponding to the above stated concavity formed in the first semiconductor 120, the active layer 130 has a convex portion 131, which performs a function equivalent to an optical convex lens. On the active layer 130, a p-type second semiconductor layer 140 is epitaxially grown and one surface 141 of the second semiconductor layer 140 serves as a mirror. A negative electrode 150 is formed on one surface 111 of the semiconductor substrate 110, so as to be in the shape of a ring having an opening 151 in the center. This opening 151 surrounds the convex portion 131 of the active layer 130. On the surface 141 of the second semiconductor layer 140, an insulating film 160 is formed. This insulating film 160 has an extremely small contact hole 161 in a position opposed to the central portion of the opening 151 of the negative electrode 150. A positive electrode 170 is formed on this insulating film 160 and is electrically connected to the surface 141 of the second semiconductor layer 140 through the contact hole 161 of the insulating film 160.

The active layer 130 is formed of a material having a forbidden band width smaller than the respective forbidden band widths of the materials forming the semiconductor substrate 110, the first semiconductor layer 120 and the second semiconductor layer 140. The material forming the active layer 130 has a large refractive index with respect to the laser light to be oscillated, as compared with the refractive indexes of the respective materials forming the other semiconductor layers, whereby the convex portion 131 of the active layer 130 functions as an optical convex lens.

Next, the operation of the surface emitting semiconductor laser shown in FIG. 2 will be described in the following. When voltage is applied between the positive electrode 170 and the negative electrode 150, current $i_2$ flows between the positive electrode 170 and the negative electrode 150. Since the positive electrode 170 and the second semiconductor layer 140 are electrically connected only through the extremely small contact hole 161, the current density of this current $i_2$ becomes large in the vicinity of the positive electrode 170 and becomes small in the vicinity of the negative electrode 150, as shown by the dotted lines in FIG. 2.

On the other hand, carrier confinement effect functions in the active layer 130, causing increase in the concentration of holes and electrons injected into the active layer 130, since the active layer 130 is interposed between the first semiconductor layer 120 and the second semiconductor layer 140 and the forbidden band width of the active layer 130 is smaller than those of the materials respectively forming the semiconductor substrate 110, the first semiconductor layer 120 and the second semiconductor layer 140. In consequence, when a current $i_2$ exceeding a threshold value flows, stimulated light emission is caused. Since the active layer 130 has the convex portion 131, the thickness of this active layer 130 becomes large in the vicinity of the center of the convex portion 131, namely in the vicinity of the optical axis of the optical convex lens and becomes small according to the distance from the optical axis. Accordingly, the gain of the light emitted in a stimulated manner becomes large in the vicinity of the optical axis and becomes small in the regions distant from the optical axis. Furthermore, the stimulated light is converged toward the optical axis by means of the convex portion 131.

As a result, light moves back and forth repeatedly between a pair of mirrors constituted by one surface 111 of the semiconductor substrate 110 and the surface 141 of the second semiconductor layer 140. This optical path is shown by the chain line in FIG. 2. More specifically, the light $l_2$ moves back and forth in a direction shown by the arrows and is amplified when it passes through the active layer 130, so that laser oscillation occurs. A part of the laser light generated as the result is emitted to the exterior from one surface 111 of the semiconductor substrate 110, as shown by the arrow $L_2$.

In a surface emitting semiconductor laser having the above described structure and operating in the above described manner, the gain of the practically utilized light in the vicinity of the optical axis is large and there is little amount of current consumed ineffectively in the regions with a small gain of light, distant from the optical axis. More specifically, light and current can be effectively utilized and as a result, laser oscillation of high efficiency can be realized with low active current. In addition, since the light emitted in a stimulated manner in the vicinity of the convex portion 131 of the active layer 130 is converged in the direction of the optical axis, an optical path and an oscillation mode both stabilized can be obtained.

Now, comparison will be made between the surface emitting semiconductor laser shown in FIG. 2 and the previously stated semiconductor laser of an end surface light emission type having a concave portion invented by K. Shima et al. and published in Appl. Phys. Lett. Vol. 38(8) pp. 605–606. The latter is called a buried convex waveguide structure laser and will be referred to hereinafter simply as a BCS laser.

Figure 3:
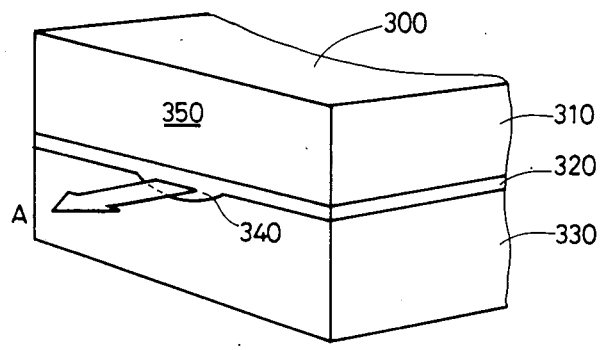
FIG. 3 is a partial perspective view of a conventional buried convex waveguide structure laser.
Figure 4:
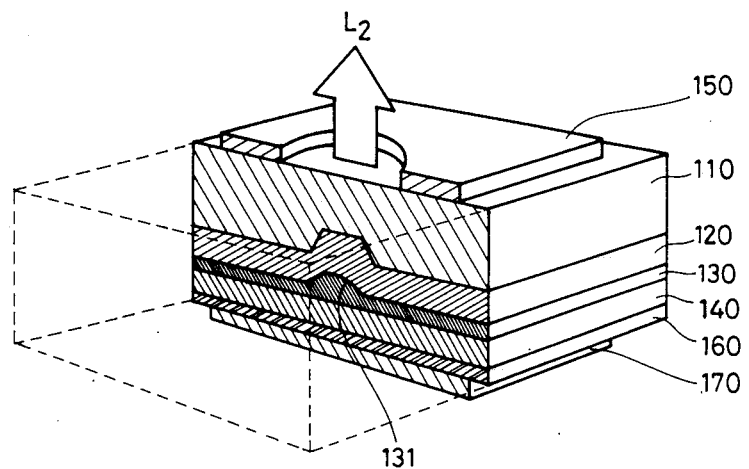
FIG. 4 is a perspective view showing a central section of a surface emitting semiconductor laser shown in FIG. 2.

A partial perspective view of a BCS laser is shown in FIG. 3. This BCS laser comprises an active layer 320 sandwitched between first and second semiconductor regions 310 and 330. The active layer 320 is formed so as to be parallel to the major surface 300 of the semiconductor crystal and to have a convex region 340 exposed on a cleavage plane 350 of the crystal. The convex region 340 functions as an optical convex lens. Accordingly, in the BCS laser, laser light is emitted in a direction shown by the arrow A. On the other hand, a perspective view showing a central section of a surface emitting semiconductor laser in FIG. 2 is illustrated in FIG. 4. This surface emitting semiconductor laser comprises as described above, an active layer 130 provided with a convex portion 131 functioning as an optical convex lens, from which laser light $L_2$ is emitted in converged manner, in a direction perpendicular to this active layer 130.

The semiconductor lasers respectively shown in FIGS. 3 and 4 are similar to each other in that a concave portion is contained in the interior, but there is much difference between them in the structure, the operation etc. Specifically stated, in the BCS laser in FIG. 3, a cleavage plane is utilized and laser light is emitted in direction parallel to the major surface of the semiconductor crystal. Accordingly, assembling and handling of the BCS laser are complicated and most of the disadvantages involved in an end surface light emission type semiconductor laser are still unsolved. In addition, in order to reduce the divergence, the width of the convex region 340 must be made small, which causes undesirable decrease of output. On the contrary, as for the semiconductor laser in FIG. 4, assembling and handling are easy because of the surface emitting type and the same handling as in case of a light emitting diode can be made. In addition, divergence of laser light can be made narrow by suitably adjusting the curvature of the convex portion 131 of the active layer 130, without lowering output.

Now, description will be made of a method of manufacturing a surface emitting semiconductor laser in accordance with an embodiment of the present invention, referring to FIGS. 5 to 9. It is to be noted that the vertical relation in FIGS. 5 to 9 is reversed with respect to the vertical relation in FIG. 2.

Figure 5:
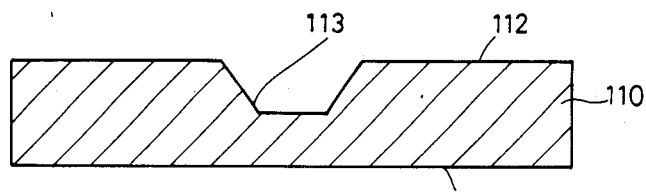
FIGS. 5 to 9 are sectional views of a surface emitting semiconductor laser in major steps of a manufacturing method of the surface emitting semiconductor laser in accordance with an embodiment of the present invention, respectively.

Referring to FIG. 5, first, there is provided a semiconductor substrate formed of aluminum-gallium-arsenide $Al_xGa_{1-x}As$ ($0<x<1$) having a thickness of 50 $\mu$m, one surface 111 thereof being a mirror and the other surface 112 thereof being a (100) oriented crystal surface. Typically, this semiconductor substrate 110 can be formed of $Al_{0.6}Ga_{0.4}As$ having n-type impurity concentration of $3 \times 10^{17}$ cm$^{-3}$. Using an ordinary selective chemical etching process, a concave portion 113 shown in FIG. 5 is formed in the surface 112 of this semiconductor substrate 110. This concave portion 113 has the shape of a truncated cone almost precisely, the diameter in the opening being 10 to 30 $\mu$m (typically 20 $\mu$m) and the depth being 3 to 30 $\mu$m (typically 10 $\mu$m).

Figure 6:
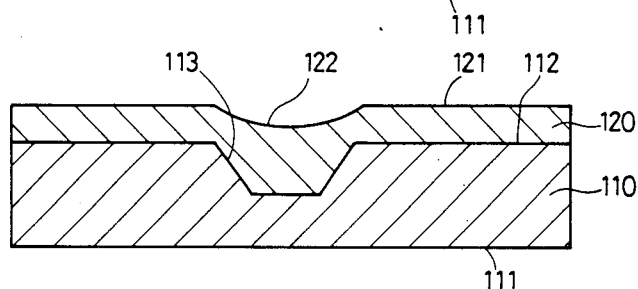

Then, as shown in FIG. 6, a first semiconductor layer 120 is formed on the surface 112 and in the concave portion 113, by the ordinary liquid phase epitaxy technique. This first semiconductor layer 120 is formed of aluminum-gallium-arsenide $(Al_yGa_{1-y}As: 0<y<1)$ having a thickness of 1 $\mu$m from the surface 112 to the surface 121. Typically, the first semiconductor layer 120 is formed of $Al_{0.4}Ga_{0.6}As$ having n-type impurity concentration of $3 \times 10^{17}$ cm$^{-3}$. In the forming process, this first semiconductor layer 120 is obtained to have a concavity 122 opposed to the concave portion 113 of the semiconductor substrate 110, since the growing rate of the semiconductor layer is slow on the (100) oriented crystal surface and becomes fast on the side surface of the concave portion 113. The maximum value of the depth of this concavity 122 is 6 μm in case where the depth of the concave portion 113 of the semiconductor substrate 110 is 10 μm.

Figure 7:
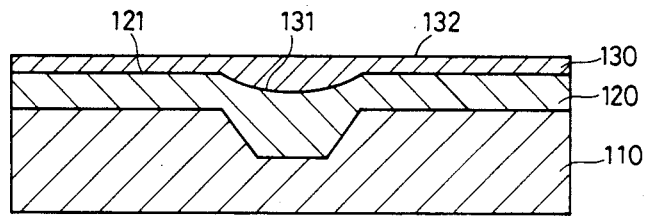

After that, as shown in FIG. 7, a p-type active layer 130 is formed on the surface 121 and the concavity 122 of the first semiconductor layer 120, using the ordinary epitaxy technique. This active layer 130 has a thickness of 5μm from the surface 131 of the first semiconductor layer 120 to the surface 132 and is formed of gallium-arsenide (GaAs) having p-type impurity concentration of $2 \times 10^{18}$ cm$^{-3}$. Corresponding to the concavity 122 provided in the first semiconductor layer 120, a convex portion 131 is provided in this active layer 130. The maximum value of the height of the convex portion 131 is 6 μm, equal to the depth of the concavity 122 of the first semiconductor layer 120, in case where the depth of the concave portion 113 of the semiconductor substrate 110 is 10 μm. The growing rate of the active layer 130 differs depending on the crystal orientation of a region on which growth is to be made. In the case shown in FIG. 7, the growing rate of the active layer 130 increases on the surface 121 of the first semiconductor layer 120 and decreases on the concavity 122. Such difference of the growing rate becomes larger as the temperature becomes lower. In this embodiment, an almost plane surface 132 of the active layer 130 can be obtained by decreasing the temperature lowering rate to a value as small as approximately 0.3° C./sec.

Figure 8:
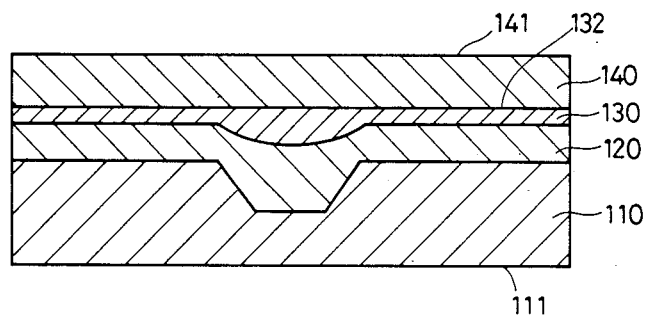

Subsequently, as shown in FIG. 8, a p-type second semiconductor layer 140 is formed on the surface 132 of the active layer 130, using the ordinary liquid epitaxy technique. This second semiconductor layer 140 is formed of aluminum-gallium-arsenic ($Al_zGa_{1-z}As: 0 < z < 1$) having a thickness of 2 μm. Typically, this second semiconductor layer 140 is formed of $Al_{0.5}Ga_{0.5}As$ having p-type impurity concentration of $1 \times 10^{18}$ cm$^{-3}$, the surface 141 thereof being a mirror.

Figure 9:
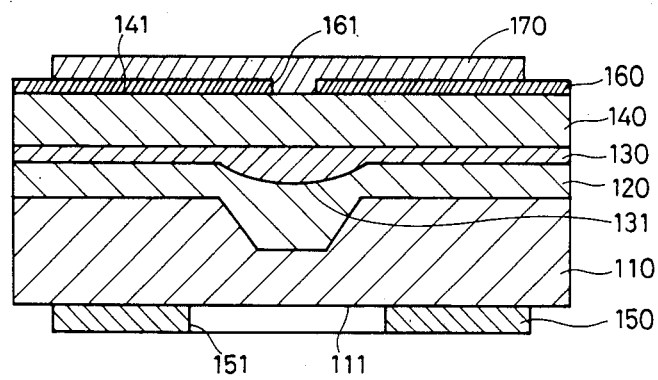

Then, a negative electrode 150 in the shape of a ring having an opening 151 is formed on the surface 111 of the semiconductor substrate 110 (see FIG. 9). On the surface 141 of the second semiconductor layer 140, an insulating film 160 having an extremely small contact hole 161 is formed. Finally, a positive electrode 170 electrically connected to the second semiconductor layer 140 through the contact hole 161 is formed on the insulating film 160, and thus manufacturing of the surface emitting semiconductor laser is completed. The size of the contact hole 161, namely, the size of junction between the positive electrode 170 and the second semiconductor layer 140 is 1 to 20 μmφ or typically 5 μmφ and the size of the opening 151 of the negative electrode 150 is 15 to 50 μmφ or typically 30 μmφ.

Figure 1:
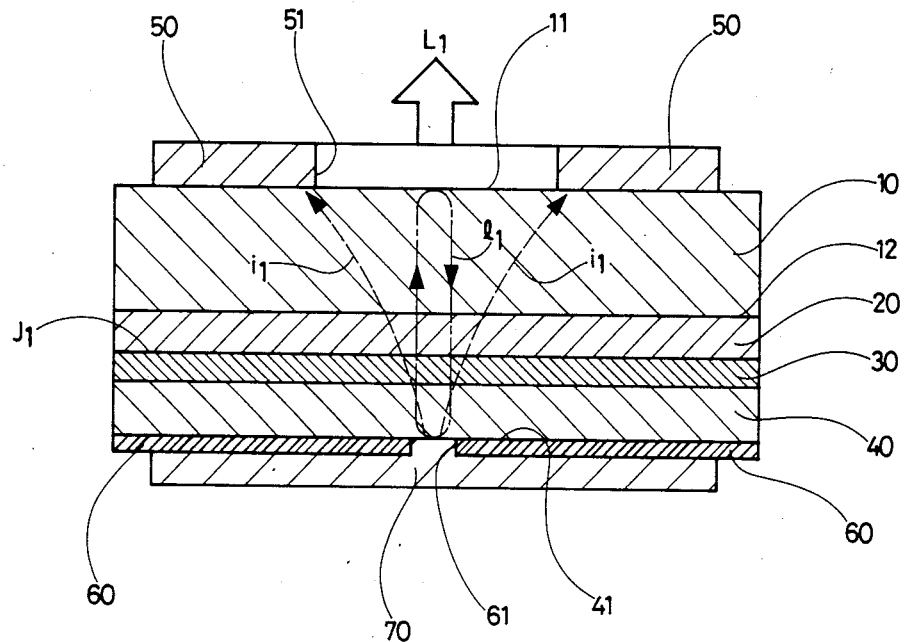
FIG. 1 is a sectional view of a conventional surface emitting semiconductor laser.

In the surface emitting semiconductor laser thus manufactured, a threshold current of 0.5A and electric power efficiency of 2.0% at the room temperature are obtained, while the threshold current is 1.5A and the electric power efficiency is 0.1% at the room temperature in case of a conventional surface emitting semiconductor laser shown in FIG. 1. Specifically stated, laser oscillation with low active current and high efficiency can be obtained, as compared with a conventional surface emitting semiconductor laser.

Although in the above described embodiment, the semiconductor substrate 110 and the first semiconductor layer 120 are of n-type and the second semiconductor layer 140 is of p-type, the same results can be obtained also in case where the semiconductor substrate 110 and the first semiconductor layer 120 are of p-type and the second semiconductor layer 140 is of n-type.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface emitting semiconductor laser comprising:
    an active semiconductor layer having a first surface and a second surface opposed to said first sufface, at least one of sAid first and second surfaces having a convex portion;
    first and second semiconductor regions on said first and second surfaces respectively; and
    first and second electrodes electrically connected respectively to said first and second semiconductor regions, said surfaces emitting laser light in a direction perpendicular to said active semiconductor layer when voltage is applied between said first and second electrodes.

2. A surface emitting semiconductor laser in accordance with claim 1, wherein
    said active layer is of a first conductive type, said first semiconductor region comprises a first semiconductor layer in contact with said active layer and a semiconductor substrate formed on said first semiconductor layer, said first semiconductor layer and said semiconductor substrate are of a second conductive type and said second semiconductor region is a second semiconductor layer of said first conductive type.

3. A surface emitting semiconductor laser in accordance with claim 2, wherein
    said convex portion is formed in said first surface, said first semiconductor layer and said semiconductor substrate are joined to each other to form a junction interface and said junction interface has a concave portion in a position opposed to said convex portion of said first surface so that said concave portion is dented from said first semiconductor layer toward said semiconductor substrate.

4. A surface emitting semiconductor laser in accordance with claim 3, where in
    said semiconductor substrate has a substrate surface opposed to said junction interface, said second semiconductor layer has a layer surface opposed to said second surface of said active layer and said substrate surface and said layer surface both function as mirrors.

5. A surface emitting semiconductor laser in accordance with claim 4, wherein
    said first electrode is formed on said substrate surface and has a first opening in a position opposed to said convex portion; said second electrode is formed on an insulating layer formed on said layer surface, said insulating layer having a second opening in a position opposed to said convex portion, and said second opening being smaller than said first opening; and said second electrode is electrically connected to said second semiconductor layer, through said second opening.

6. A surface emitting semiconductor laser in accordance with claim 2, wherein
the semiconductor forming said active layer has a forbidden band width smaller than the respective forbidden band widths of the semiconductors forming said semiconductor substrate, said first semiconductor layer and said second semiconductor layer.

7. A surface emitting semiconductor laser in accordance with claim 6, wherein
a refractive index of said active layer with respect to said laser light is larger than the respective refractive indexes of said semiconductor substrate, said first semiconductor layer and said second semiconductor layer.

8. A surface emitting semiconductor laser in accordance with claim 7, wherein
said active layer is made of gallium-arsenis (GaAs); said semiconductor substrate is made of aluminum-gallium-arsenide ($Al_xGa_{1-x}As$) with the condition of $0<x<1$; said first semiconductor layer is made of aluminum-gallium arsenide ($Al_yGa_{1-y}As$) with the condition of $0<y<1$; and said second semiconductor layer is made of aluminum-gallium-arsenide ($Al_zGa_{1-z}As$) with the condition of $0<z<1$.

9. A surface emitting semiconductor laser as recited in claim 1, wherein said convex portion is formed in a predetermined region of said first surface of said active semiconductor layer, further including means for restricting current flow to said predetermined region of said active semiconductor layer including said convex portion.

10. A surface emitting semiconductor laser as recited in claim 9, further comprising an insulating film opposite said second surface of said active semiconductor layer, said second electrode being formed on said insulating film, and
said means for restricting current flow comprises a small opening in said insulating film for providing electrical connection between said second electrode and said active semiconductor layer and for restricting said current flow.

11. A surface emitting semiconductor laser as recited in claim 10, wherein said insulating film is formed on said second semiconductor region and said second electrode is formed on said insulating film.

12. A surface emitting semiconductor laser as recited in claim 11 wherein said small opening in said insulating film has a diameter in the range of 1 to 20 microns for increasing current density in said second semiconductor layer between said small opening said active semiconductor layer.

13. A surface emitting semiconductor laser as recited in claim 10 wherein said small opening in said insulating film has a diameter in the raage of 1 to 20 microns.

14. In a surface emitting semiconductor laser including an active semiconductor layer having a first surface and a second surface opposed to said first surface, first and second semiconductor layers respectively formed on said first and second surfaces and first and second electrodes electrically connected respectively to said first and second semiconductor layers, said surfaces emitting laser light in a direction perpendicular to said active semiconductor layer when voltage is applied between said first and second electrodes, the improvement comprising:
converging means formed in a predetermined region of said active semiconductor layer within said laser for converging said laser light, and
restricting means for restricting current flow to said predetermined region of said active semiconductor layer.

15. An improved surface emitting semiconductor laser as recited in claim 14 wherein said converging means comprises a convex region of said active semiconductor layer.

16. An improved surface emitting semiconductor laser as recited in claim 15 wherein said restricting means comprises an insulating film formed on said second semiconductor layer between said second semiconductor layer and said second electrode, said insulating film having an extremely small opening opposite said convex region of said active semiconductor layer for restricting said current flow to said convex region of said active semiconductor layer.

* * * * *